United States Patent [19]

Ishihara et al.

[11] Patent Number: 4,492,605
[45] Date of Patent: Jan. 8, 1985

[54] METHOD OF MAKING PHOTOVOLTAIC DEVICE

[75] Inventors: Shin-ichiro Ishihara, Hirakata; Takashi Hirao, Ikoma; Koshiro Mori, Osaka; Motonori Mochizuki, Hirakata, all of Japan

[73] Assignee: Matsushita Electric Industrial Co., Ltd., Kadoma, Japan

[21] Appl. No.: 476,707

[22] Filed: Mar. 18, 1983

[30] Foreign Application Priority Data

Mar. 19, 1982 [JP] Japan .................. 57-44922

[51] Int. Cl.³ ............... C23C 13/10; H01L 31/18
[52] U.S. Cl. .................... 148/174; 148/175; 427/85; 427/86; 136/258
[58] Field of Search ........... 136/258 AM; 204/192 S; 148/174, 175; 427/180, 183, 85, 86, 39; 118/718, 719, 723

[56] References Cited

U.S. PATENT DOCUMENTS

| 4,015,558 | 4/1977 | Small et al. | 118/719 |
| 4,400,409 | 8/1983 | Izu et al. | 136/258 AM |
| 4,417,092 | 11/1983 | Moustakas et al. | 136/258 AM |

FOREIGN PATENT DOCUMENTS

| JA0125681 | 9/1980 | Japan | 136/258 AM |
| JA0114387 | 9/1981 | Japan | 136/258 AM |

OTHER PUBLICATIONS

G. F. Barber, IBM Technical Disclosure Bulletin, vol. 11, No. 7, Dec. 1968.
Kumano et al, "Photovoltaic Behavior of Amorphous Si:H and Si:F:H Solar Cells", Conf. Rec. 15th IEE Photovoltaic Specialists Conf., May 12-15, 1981, pub. Aug. 1981.

Primary Examiner—Brian E. Hearn
Assistant Examiner—Hunter L. Auyang
Attorney, Agent, or Firm—Cushman, Darby & Cushman

[57] ABSTRACT

A method for making photovoltaic device comprising the steps of moving at least one substrate into a reaction chamber, causing a plasma reaction of raw material gases in said reaction chamber, thereby forming an amorphous silicon layer of a first conductivity type on said substrate, moving said at least one substrate into a next reaction chamber for a next plasma reaction, causing said next plasma reaction of next raw material gases in said reaction chamber, thereby forming a second amorphous silicon layer of a second conductivity type on said layer of the first conductivity type, the improvement being in after finishing said forming of said an amorphous silicon layer of a first conductivity type, changing the gas atmosphere of said reaction chamber into a different atmosphere which is substantially identical and of equal pressure to the next gas atmosphere of said next reaction chamber, and thereafter moving said substrate to said next reaction chamber.

6 Claims, 3 Drawing Figures

METHOD OF MAKING PHOTOVOLTAIC DEVICE

BACKGROUND OF THE INVENTION

1. Field of the Invention:

The present invention relates to an improvement in the method for making photovoltaic devices.

More particularly the present invention concerns an improvement in the method for making photovoltaic devices by sequentially accumulating plural amorphous silicon layers of different conductivities on a substrate by means of plasma reactions of material gases containing impurity gas.

2. Description of the Prior Art:

A typical example of the conventional method and its problem in the method for making photovoltaic devices utilizing sequential accumulation of plural amorphous silicon layers of different conductivities on a substrate by plasma reaction of material gases with impurity gas is elucidated with reference to FIG. 1 showing a sectional elevation view of the general photovoltaic device, and FIG. 2 showing sectional elevation view of general apparatus for making the photovoltaic device.

As shown in FIG. 1, the photovoltaic device comprises a transparent substrate 162, such as glass, a transparent conductive film 2 such as indium oxide or tin oxide, plural amorphous silicon layers 3 and a back face electrode 4 such as aluminum film. The plural amorphous silicon layers 3 comprises a p-type layer 5 formed on the transparent electrode 2, an i-type (non-doped) layer 6 formed on the p-type layer 5 and an n-type layer 7 formed on the i-type layer 6. The amorphous silicon layers 3 are accumulatedly formed by sequential plasma reactions in silane gases containing an appropriate impurity gas. The pure amorphous silicon layer is a weak n-conductivity type, and accordingly a very small amount of p-type impurity may be added to make the layer 6 a pure i-type layer. Furthermore, an impurity of IV-th group element such as Ge or Sn may be added in order to decrease optical inhibition band width of the i-type layer, so as to adjust the spectral characteristic to that of a light source to be in conjunction therewith used.

FIG. 2 shows the configuration of a conventional plasma reaction apparatus for making plural amorphous layers 3 on the substrate 162. The apparatus has a row of chambers 10a, 10b and 10c each having shutters 19a, 19b, 19c or 19d on partitions 18, 18 . . . . The chambers 10a, 10b and 10c are reaction chambers. The chambers 10a, 10b and 10c has gas inlet valves 11a, 11b and 11c gas outlet valves 12a, 12b and 12c, respectively. The valve 11a controls feeding of silane (SiH4) gas and diborane (B2H6) gas as impurity, the valve 11b controls silane gas and the valve 11c controls silian gas and phosphine (PH3) gas as impurity, respectively, and the valves 12x, 12a, 12b and 12c are connected to vacuuming apparatus and is for controlling evacuation of the chambers 10a, 10b and 10c, respectively. The chambers 10a, 10b and 10c have electrodes 13a, 13b and 13c and electrodes 14a, 14b and 14c, respectively, which are disposed opposing each other in the chambers, and are supplied with AC voltage from an AC power source thereacross for plasma reaction.

A roller conveyer 161 is disposed throughout the row of the chambers for conveying substrates 162, 162 . . . through the row of the chambers. The shutters 19a, 19b, 19c and 19d are open only when moving the substrate step by step from the chambers 10a to the chamber 10c.

A conventional method of making the photovoltaic device by utilizing the apparatus of FIG. 2 is as follows.

Firstly, a substrate 162 having a transparent conductive film 2 is brought into the chamber 10a through the opening 17a by means of the roller conveyer 161. At this time shutters other than 19a are closed, and after putting the substrate into the chamber the roller conveyer 161 is stopped and the first shutter 19a is closed. A at this stage, all the valves 11a to 11c and 12a to 12c are closed, and no AC voltage is fed across the first and the second electrodes 13a to 13c and 14a to 14c. Then the chambers are evacuated by opening the evacuation valves 12a to 12c, and by opening the first feeding valve 11a the first reaction chamber 10a is filled with silane gas containing a small amount of diborane gas as impurity, and at this stage the AC voltage from the AC power source 15 is supplied across the electrodes 13a and 14a, thereby producing the plasma reaction to form a first silicon film 5 of p-conductivity type on the transparent conductive film 2.

After the forming of the p-type silicon layer 5, the AC voltage across the electrodes 13a and 14a is shut off, and the first reaction chamber 10a is evacuated. Thereafter, the second shutter 19b is opened and the substrate 162 is moved to the second reaction chamber 10b, and thereafter the shutter 19b is closed. Then the second reaction chamber 10b is filled with silane gas and the AC voltage is supplied across the electrodes 13b and 14b, thereby causing the plasma reaction in the second chamber, to form the second silicon layer 6 of i-conductivity type. Thereafter, the supply of AC voltage is stopped and the chamber 10b is evacuated by handling the valve 12b, and by opening the shutter 19c the substrate is moved into the third reaction chamber 10c, and the shutter 9c is closed. Thereafter, the third reaction chamber 10c is filled with silane gas containing a small amount of phosphine gas and the AC voltage is impressed across the electrodes 13c and 14c to form the plasma reaction, and the third silicon layer 7 of n-conductivity type is formed.

In the above-mentioned conventional method to form plural amorphous silicon layers of different conductivity types on a substrate, there has been the following shortcoming: The substrate moving is made after evacuation of a chamber where a silicon layer is formed, thereby the evacuation of the chamber was made each time for movement of the substrate to next chamber, and the supply of AC voltage is to be stopped also, and only one reaction chamber of the three reaction chambers is utilized at one time and other two reaction chambers are vacant. Therefore, a considerable time is wasted for the evacuations of the used gas and removing of a substrate to the next reaction chamber, and also the material gas was wasted.

SUMMARY OF THE INVENTION

Accordingly, the present invention provides an improved method for making a photovoltaic device wherein the above-mentioned shortcoming is eliminated, that is, amorphous silicon layers can be accumulatedly formed without interruption for evacuation, without adverse influence to forming of necessary conductivity types of the layers.

The essence of the present invention is that after forming a first silicon layer in one reaction chamber and before forming a next silicon layer of a different conductivity type in a next reaction chamber, intermediate an step is inserted and before moving the substrate to the next reaction chamber, the atmosphere of the former reaction chamber is changed to what is identical to and of equal pressure to that of the next reaction chamber, or before moving the substrate to the next reaction chamber the atmosphere of the next reaction chamber is changed to what is identical to and of equal pressure to that of the former reaction chamber, thereby eliminating evacuation of the reaction chambers at moving steps of the substrate. Accordingly, this enables movement of the substrates under continuous plasma reactions in a rows of the reaction chambers, hence improving productivity of the manufacturing.

DESCRIPTION OF THE PREFERRED EMBODIMENT

Method of manufacturing photovoltaic device in accordance with the present invention comprises the steps of moving at least one substrate into one reaction chamber, causing raw plasma reaction of a material gases in the one reaction chamber, thereby forming an amorphous silicon layer of a first conductivity on said substrate, moving the at least one substrate into a next reaction chamber for a next plasma reaction, causing said next plasma reaction of another raw material gas in the next reaction chamber, thereby forming a second amorphous silicon layer of a second conductivity type on said layer of the first conductivity type, the improvement being in after finishing the forming of the amorphous silicon layer of the first conductivity type, changing the gas atmosphere of the one reaction chamber into a different atmosphere which is substantially identical and of the equal pressure to that of the next gas atmosphere of the next reaction chamber, and thereafter moving the substrate to the next reaction chamber,
or in after finishing the forming of the amorphous silicon layer of the first conductivity type, changing the gas atmosphere of the next reaction chamber into a different atmosphere which is substantially identical and of equal pressure to the gas atmosphere of the present reaction chamber, and thereafter moving the substrate to the next reaction chamber.

Figure 1:
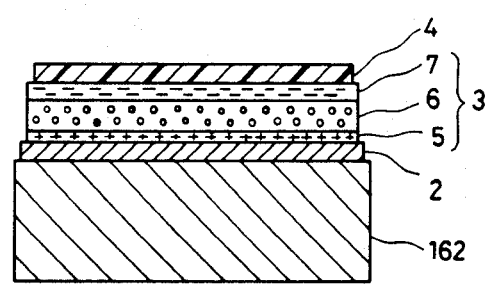
FIG. 1 is a sectional elevation view of the typical photovoltaic device.
Figure 2:
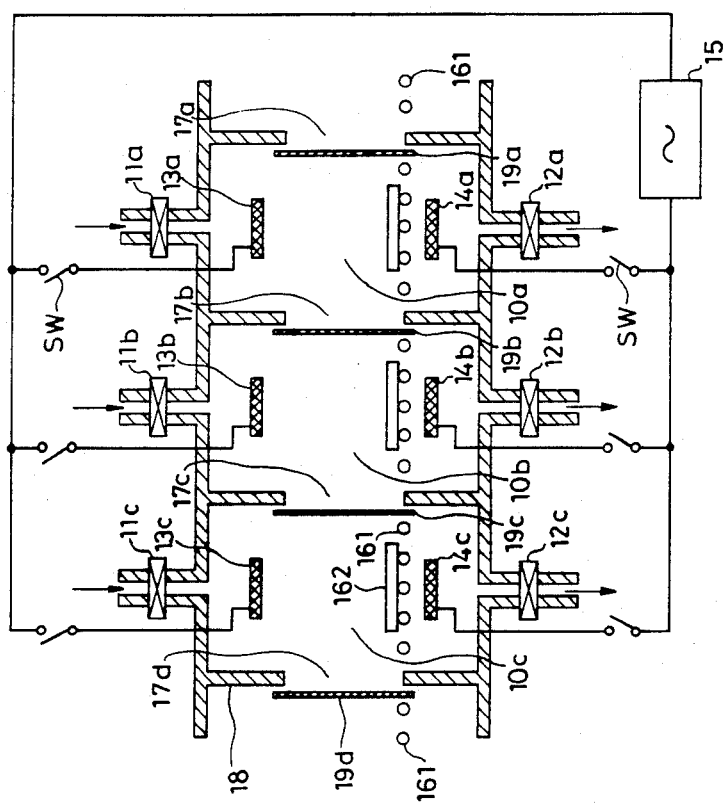
FIG. 2 is a sectional elevation view of the typical conventional manufacturing apparatus of the photovoltaic device.
Figure 3:
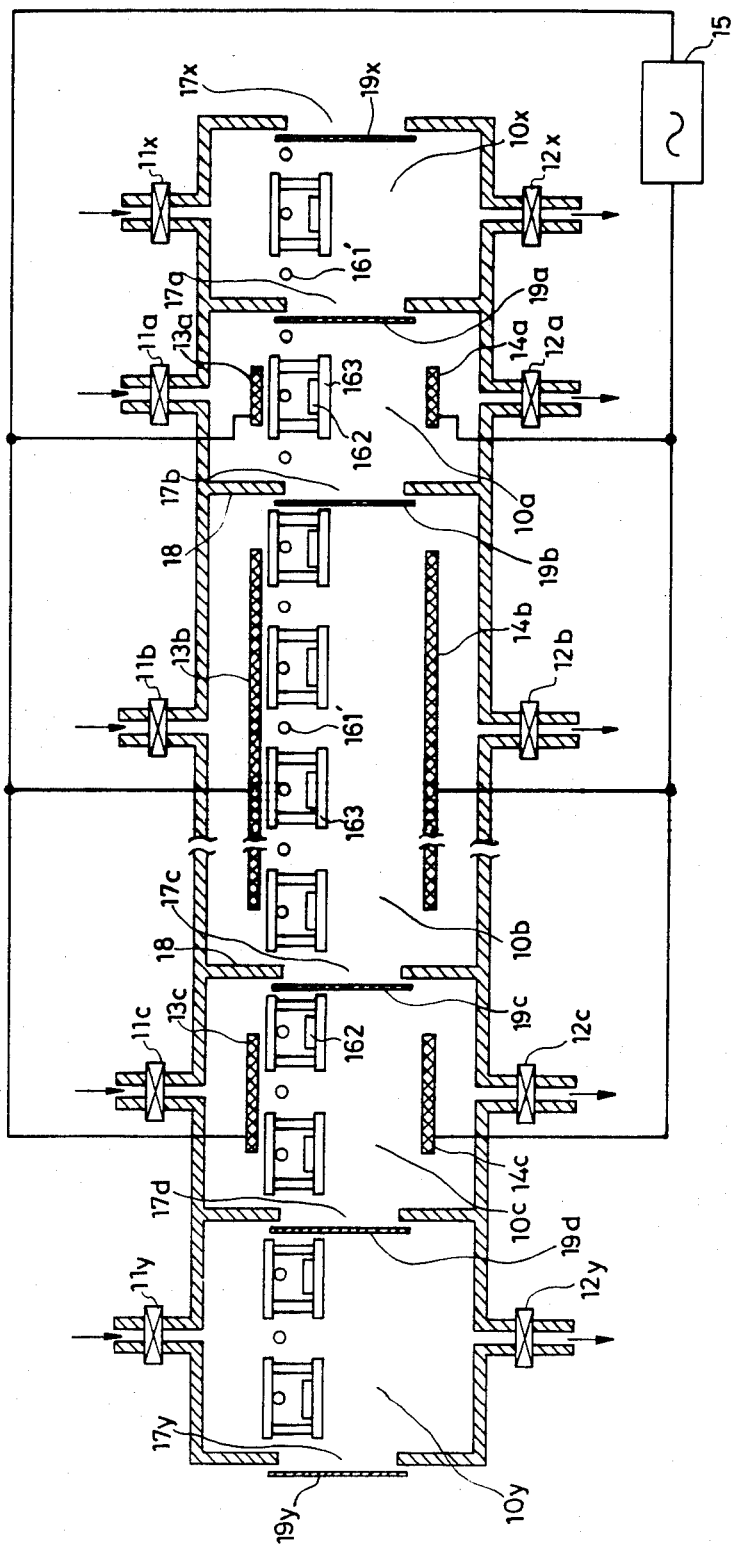
FIG. 3 is a sectional elevation view of a manufacturing apparatus for the photovoltaic device embodying the present invention.

The method for manufacturing a photovoltaic device having a configuration as shown in FIG. 1 will be described in detail with reference to FIG. 3 which is a sectional elevation view of an apparatus for manufacturing the photovoltaic device in accordance with the present invention. The apparatus has a row of reaction chambers 10a, 10b and 10c, having electrodes 13a, 13b and 13c and 14a, 14b and 14c, respectively. On both sides of the reaction chambers a pair of auxiliary chambers 10x and 10y are provided. The row of chambers has openings 17x, 17a, 17b, 17c, 17d and 17y, having shutter 19x, 19a, 19b, 19c, 19d and 19y, respectively, in a manner such that the openings and shutters are of substantially the same size and height to enable moving of substrate holders 163 therethrough. The chambers 10x, 10a, 10b, 10c and 10y have feeding valves 11x, 11a, 11b, 11c and 11y, and evacuation valves 12x, 12a, 12b, 12c and 12y, respectively. Through the row of the chambers, a continuous line of roller conveyor 161' is provided so as to move the substrate holder 163 thereby. The substrate 162 is held by the substrate holder 163 in a high position in the reaction chamber so as to be free from undesirable dust which might fall into the chambers. The first reaction chamber 10a is the smallest, for instance, so as to contain one substrate holders 163 therein, the second reaction chamber 10b is the largest, for instance, so as to contain 3 to 20 substrate holders 163 therein, and the third reaction chamber 10c is of an intermediate size between the first reaction chamber 10a and the second reaction chamber 10b, so that, for instance, it can contain two or three substrate holders 163. A feature of the present apparatus of the embodiment is that all the electrodes 13a, 13b, 13c, 14a, 14b and 14c are continuously supplied with AC voltage without interruption even when the substrate 162 is moved from one chamber to another chamber, thereby allowing the plasma reaction to be carried out without interruption. The shutters 19x, 19a, 19b, 19c, 19d and 19y are closed except during the time when moving the substrate in the substrate holder, and only one shutter of a chamber is permitted to be open at one time.

The substrate 162 in a substrate holder 163 is preliminarily heated in a first auxiliary chamber 10x to a temperature necessary for accumulation of the amorphous silicon layer thereon.

Next, the substrate 162 in the preparation chamber 10x is heated in the chamber and atmosphere of the preparation chamber 10x is changed to the identical atmosphere and the same pressure to the atmosphere of the first reaction chamber 10a. Then, shutter 19a is opened and a substrate 162 in the preparation chamber 10x is moved into the first reaction chamber 10a, and thereafter the shutter 19a is closed. The atmosphere of the preparation chamber 10x is then evacuated for preparation for the next step of introduction of a new substrate therein. In case a p-type amorphous silicon layer 5 is intended to be formed in the first reaction chamber 10a, a mixed gas of $SiH_4$ added with a small amount of $B_2H_6$ as impurity is used as material gas, which is fed through the feeding valve 11a. After forming predetermined thickness of the p-type amorphous silicon layer 5 on the substrate 162, only the additive gas $B_2H_6$ is stopped to be fed while feeding $SiH_4$ gas and retaining supply of the AC voltage across the electrodes 13a and 14a. By the stopping of the $B_2H_6$ impurity gas, the gas in the first reaction chamber 10a becomes only $SiH_4$, which is identical to that in the next reaction chamber 10b. And after adjusting the pressure of the $SiH_4$ gas is the first reaction chamber 10a to be equal to that of the second reaction chamber 10b, the shutter 19b is opened, then the substrate holder 163 is moved from the first reaction chamber 10a to the second reaction chamber 10b, and the shutter 19b is closed. Then, in the first reaction chamber 10a, another substrate 162 held in a substrate holder 163 is introduced from the preliminary chamber 10x, where the atmosphere is then prepared to be identical to and of equal pressure to the atmosphere of the first reaction chamber 10a, and the shutter 19a is opened to move the substrate holder 163 into the first reaction chamber 10a, and the shutter 19a is closed.

In the second reaction chamber 10b, the substrate 162 introduced from the first reaction chamber 10a is subject to forming of the second amorphous silicon layer 6 of i-type by feeding only SiH4 gas through the valve 11b. As has been described, a very small amount of a p-type impurity may be added in SiH4. Then the third shutter 19c is opened so that the substrate holder 163 holding the substrate 162 formed with the i-type layer 6 is moved to the third reaction chamber 10c. At this time when the shutter 19c is opened, only SiH4 gas, which is identical to and of the equal pressure to that of the reaction chamber 10b, is filled in the reaction chamber 10c. Then, after closing the shutter 19c, an impurity gas of PH3 is introduced through the feeding valve 11c into the third reaction chamber, so that an n-type amorphous silicon layer 7 is formed on the i-type layer 6. Then, the feed of impurity gas of PH3 is discontinued and thereafter, only SiH4 gas is fed, that is the used gas containing the impurity PH3 is purged through the outlet valve 12c thereby making the third reaction chamber atmosphere to be only SiH4. After forming the n-type layer 7, the fourth shutter 19d is opened and substrate 162 is moved into the auxiliary chamber 10y, where the atmosphere which is identical to and of the equal pressure to that of the third reaction chamber 10c, for instance, SiH4 including a small amount of PH3, is filled. After introducing the substrate in the auxiliary chamber 10y, the shutter 19d is closed and the substrate 162 is slowly cooled down to the room temperature and thereafter removed from the auxiliary chamber 10y by opening the shutter 19y. A back electrode 4 on the n-type amorphous silicon layer 7 may be formed in the auxiliary chamber 10y. In the above-mentioned forming steps of the amorphous n-type silicon layer, the impurity gas PH3 is carried by means of a carrier gas such as H2, Ar, He, etc.

As has been elucidated in detail with reference to the preferred embodiment, the method in accordance with the present invention has the following advantages.

Since application of the AC voltage across the electrode 13a and 14a, 13b and 14b or 13c and 14c is not interrupted even during movements of the substrate 162 from one chamber to another chamber, it is theoretically possible to carry out a continuous formation of amorphous silicon layers 3 on a substrate.

Since the plasma reaction induced by the AC voltage applied to the electrodes is not stopped through the formings of p-type, i-type and n-type silicon layer, interfaces between the different silicon layers is continuous. That is, the hydrogen concentration profile or amorphous state becomes continuous, and the method in accordance with present invention can improve performance of the photovoltaic device as shown in Table 1, which shows an example of the present invention and a prior art example which is made by forming the p-i-n layers by the conventional discreet step plasma forming method. The light source used for exposuring of the radiation sensitive resist film was of 150 lx.

TABLE 1

|  | Voc Open circuit voltage | Jsc short circuit current density | FF fill factor | Power electric power |
| --- | --- | --- | --- | --- |
| Example of the Present Invention (for | 613 mV | 11.3 μA/cm² | 0.730 | 5.05 μW/cm² |
|  | 611 | 11.5 | 0.702 | 4.93 W/cm² |

TABLE 1-continued

|  | Voc Open circuit voltage | Jsc short circuit current density | FF fill factor | Power electric power |
| --- | --- | --- | --- | --- |
| comparison) Prior Art device |  |  |  |  |

According to the present method, there are no need of purging the material gas in the reaction chamber. Accordingly, there are substantially no waste of the material gas. Furthermore, since there is no need of purging the material gases, time for the purgings can be saved during the manufacturing process, thereby improving the productivity of manufacturing.

Provided that the times needed for forming the silicon layers are as follows:

for forming p-type layer 5 . . . 1 minute.
for forming i-type layer 6 . . . 30 minutes, and
for forming n-type layer 7 . . . 3 minutes.

In the conventional batch plasma reaction method, only one reaction chamber of the three reaction chambers is used at one time while other reaction chambers are not used, the forming of three silicon layers has taken much long time. That is, when forming one substrate having p-i-n silicon layers, the first reaction chamber 10a and the third reaction chamber 10c must uselessly wait for at least 31 or 33 minutes during steps in other reaction chamber even without considering the evacuation time. Furthermore in the conventional manufacturing method, since the manufacturing steps are discrete, it has been considered that the sizes of the reaction chambers should be the same each other for efficiency of their utility. However, according to the method of the present invention, for instance, after forming the p-type layer for 1 minute in the first chamber, the substrate is moved to the second reaction chamber, wherein a second i-type layer is formed on the substrate, simultaneously with a forming of the p-type layer on a next substrate in the first reaction chamber. And then, being pushed to a down-stream position in the second reaction chamber, the former substrate is continuously subject to forming the i-type layer, and the next substrate is introduced from the first reaction chamber to the second reaction chamber. Thus in the second reaction chamber which is designed larger than the first reaction chamber, the forming of the i-type layer is continued for sufficient length of time, since the second reaction chamber has a room to retain several substrates. Then, in the third reaction chamber which has a room to retain, for instance, two substrates, the forming of the n-type layer is carried out for more than 2 minutes. Thus, there is no wasteful waiting time for the reaction chamber though there are small purging time periods needed inbetween. In the present invention, since the size of the reaction chambers are designed considering the length of the time required for steps of forming respective silicon layers, by sequentially putting the substrate in the reaction chambers in the row, an efficient processing is achievable.

Furthermore, since the different conductivity type silicon layers are formed in different reaction chambers, respectively, adverse effect by residual impurity in the reaction chamber is eliminated.

Furthermore, in the first reaction chamber, after forming the p-type silicon layer by feeding the SiH4 gas with B$_2$H$_6$ as impurity gas, followed by stopping the feeding of the impurity gas B$_2$H$_6$ hence retaining only SiH$_4$ gas, the first reaction chamber becomes to contain the second i-type silicon layer 7 with a small residual amount of boron. And therefore by means of this residual amount of boron, an inclined electric field in the i-type silicon layer can be formed.

In the third reaction chamber, on the other hand, a sloped electric field is automatically formed by means of PH$_3$. That is, in the third reaction chamber, by firstly feeding SiH$_4$ and gradually increasing the PH$_3$ as impurity gas, the n-type layer has a sloped concentration which is highest at the surface of the n-type layer.

By the use of sloped electric fields in the second layer 6 of i-type and third layer 7 of n-type, the resulting photovoltaic device has improved characteristics.

What is claimed is:

1. A method for making photovoltaic device comprising the steps of moving at least one substrate into a reaction chamber, causing a plasma reaction of raw material gases in said reaction chamber, thereby forming an amorphous silicon layer of a first conductivity type on said substrate, moving said at least one substrate into a next reaction chamber for a next plasma reaction, causing said next plasma reaction of next raw material gases in said next reaction chamber, thereby forming a second amorphous silicon layer of a second conductivity type of said layer of the first conductivity type, the improvement being in after finishing said forming of said an amorphous silicon layer of a first conductivity type, changing the gas atmosphere of said reaction chamber into a different atmosphere which is substantially identical and of equal pressure to the next gas atmosphere of said next reaction chamber, and thereafter moving said substrate to said next reaction chamber.

2. A method for making photovoltaic device in accordance with claim 1, wherein said raw material gases in said reaction chamber contains an impurity gas to give said first conductivity type to said amorphous silicon layer, and said next raw material gases in said next reaction chamber at least substantially does not contain any impurity gas.

3. A method for making a photovoltaic device comprising the steps of moving at least one substrate into a reaction chamber, causing a plasma reaction of raw material gases in said reaction chamber, thereby forming an amorphous silicon layer of a first conductivity type, moving said at least one substrate into a next reaction chamber for a next plasma reaction, causing said next plasma reaction of next raw material gases in said next reaction chamber, thereby to form second amorphous silicon layer of a second conductivity type on said layer of the first conductivity type, the improvement being in after finishing said forming of said amorphous silicon layer of the first conductivity type, changing the next gas atmosphere of said next reaction chamber into another different atmosphere which is substantially identical and of equal pressure to the gas atmosphere of said reaction chamber, and thereafter moving said substrate to said next reaction chamber.

4. A method for making photovoltaic device in accordance with claim 3, wherein said raw material gases in said reaction chamber at least substantially does not contain any impurity gas and said next raw material gases in said next reaction chamber contains an impurity gas to give a second conductivity type to said second amorphous silicon layer.

5. A method for making photovoltaic device in accordance with either of claim 1, 2, 3 or 4, wherein said plasma reactions in said reaction chamber and in said next reaction chamber are carried out without intermission even during said movings of substrates.

6. A method for making photovoltaic device in accordance with either of claim 1, 2, 3 or 4, wherein said moving of said substrates from said reaction chamber into said next reaction chamber is carried out by opening a shutter of an opening in a partition between said reaction chamber and said next reaction chamber while closing other shutters of both the reaction chambers.

* * * * *